US006664707B2

(12) United States Patent
Jerman et al.

(10) Patent No.: US 6,664,707 B2
(45) Date of Patent: Dec. 16, 2003

(54) MINIATURE DEVICE WITH TRANSLATABLE MEMBER

(75) Inventors: John H. Jerman, Palo Alto, CA (US); John D. Grade, Mountain View, CA (US)

(73) Assignee: Iolon, Inc., San Jose, CA (US)

( * ) Notice: Subject to any disclaimer, the term of this patent is extended or adjusted under 35 U.S.C. 154(b) by 0 days.

(21) Appl. No.: 10/100,253

(22) Filed: Mar. 14, 2002

(65) Prior Publication Data

US 2002/0162675 A1 Nov. 7, 2002

Related U.S. Application Data

(60) Provisional application No. 60/276,560, filed on Mar. 15, 2001.

(51) Int. Cl.[7] .................................................. H02N 2/00

(52) U.S. Cl. ...................................................... 310/309

(58) Field of Search .......................................... 310/309

(56) References Cited

U.S. PATENT DOCUMENTS 5,998,906 A * 12/1999 Jerman et al. .............. 310/309
6,469,415 B2 * 10/2002 Jerman et al. .............. 310/309
6,541,892 B2 * 4/2003 Hoen .......................... 310/309
6,552,839 B1 * 4/2003 Hong et al. .................. 359/290
2001/0036206 A1 11/2001 Jerman et al. .............. 220/754
2002/0067103 A1 6/2002 Jerman ........................ 310/309

* cited by examiner

*Primary Examiner*—Thomas M. Dougherty
(74) *Attorney, Agent, or Firm*—Dorsey & Whitney LLP

(57) ABSTRACT

A miniature device comprising a substrate and primary and secondary movable members overlying the substrate. First and second suspension members couple the secondary movable member to the substrate. Third and fourth suspension members couple the primary movable member to the secondary movable member. A lever assembly is provided and has a pivot and a lever coupled to and pivotable about the pivot. The lever has a first extremity coupled to the primary movable member and an opposite second extremity. The secondary movable member is coupled to the lever between the first extremity and the pivot.

20 Claims, 3 Drawing Sheets

Controller 126 24 21 32 118 116 114 131 131 117 112b 106 127 129 129 57 57b 57a 58 22 23b 97 106 108 128 122 98 46b 48b 48 58 48a 23 98 101 102 112 118 108 117 46 116 106 113 118 107 119 121 47 47b 47a 63 46a 112a 108 109 23a 56b 56a 29 136 96 76b 78 76a 56 81 61 67 68 76a 82 138 66 77 76b 62 33 63a 63b 31b 31 31c 28 31a Controller

MINIATURE DEVICE WITH TRANSLATABLE MEMBER

CROSS-REFERENCE TO RELATED APPLICATION

The application claims priority to U.S. provisional patent application Ser. No. 60/276,560 filed Mar. 15, 2001, the entire content of which is incorporated herein by this reference.

FIELD OF THE INVENTION

The present invention relates generally to miniature devices and more particularly to miniature devices having translatable members.

BACKGROUND

Miniature devices, such as micromechanical or micromachined devices, are attractive for use in moving and adjusting members such as optical components. See, for example, U.S. Pat. No. 5,998,906 which discloses a linear microactuator for translating a mirror in and out of a beam of light in an optical disk drive system. A number of the microactuators disclosed therein utilize folded suspensions to provide large forward deflections. The movable members therein are limited in forward and rearward movement by mechanical stops, which define the two positions of such movable members, and are not designed for place and hold positioning between such forward and rearward positions.

In general, it is an object of the present invention to provide a miniature device having a translatable member with a relatively large adjustment range.

Another object of the invention is to provide a miniature device of the above character having a translatable member capable of place and hold positioning along a line.

Another object of the invention is to provide a miniature device of the above character in which the translatable member has a relatively high immunity along such line to external forces such as vibration.

Another object of the invention is to provide a miniature device of the above character capable of translating an optical element such as a lens.

SUMMARY OF THE INVENTION

A miniature device is provided and comprises a substrate and primary and secondary movable members overlying the substrate. First and second suspension members couple the secondary movable member to the substrate. Third and fourth suspension members couple the primary movable member to the secondary movable member. A lever assembly is provided and has a pivot and a lever coupled to and pivotable about the pivot. The lever has a first extremity coupled to the primary movable member and an opposite second extremity. The secondary movable member is coupled to the lever between the first extremity and the pivot.

BRIEF DESCRIPTION OF THE DRAWINGS

The accompanying drawings, which are somewhat schematic in some instances and are incorporated in and form a part of this specification, illustrate one embodiment of the invention and, together with the description, serve to explain the principles of the invention.

DESCRIPTION OF THE INVENTION

Figure 1:
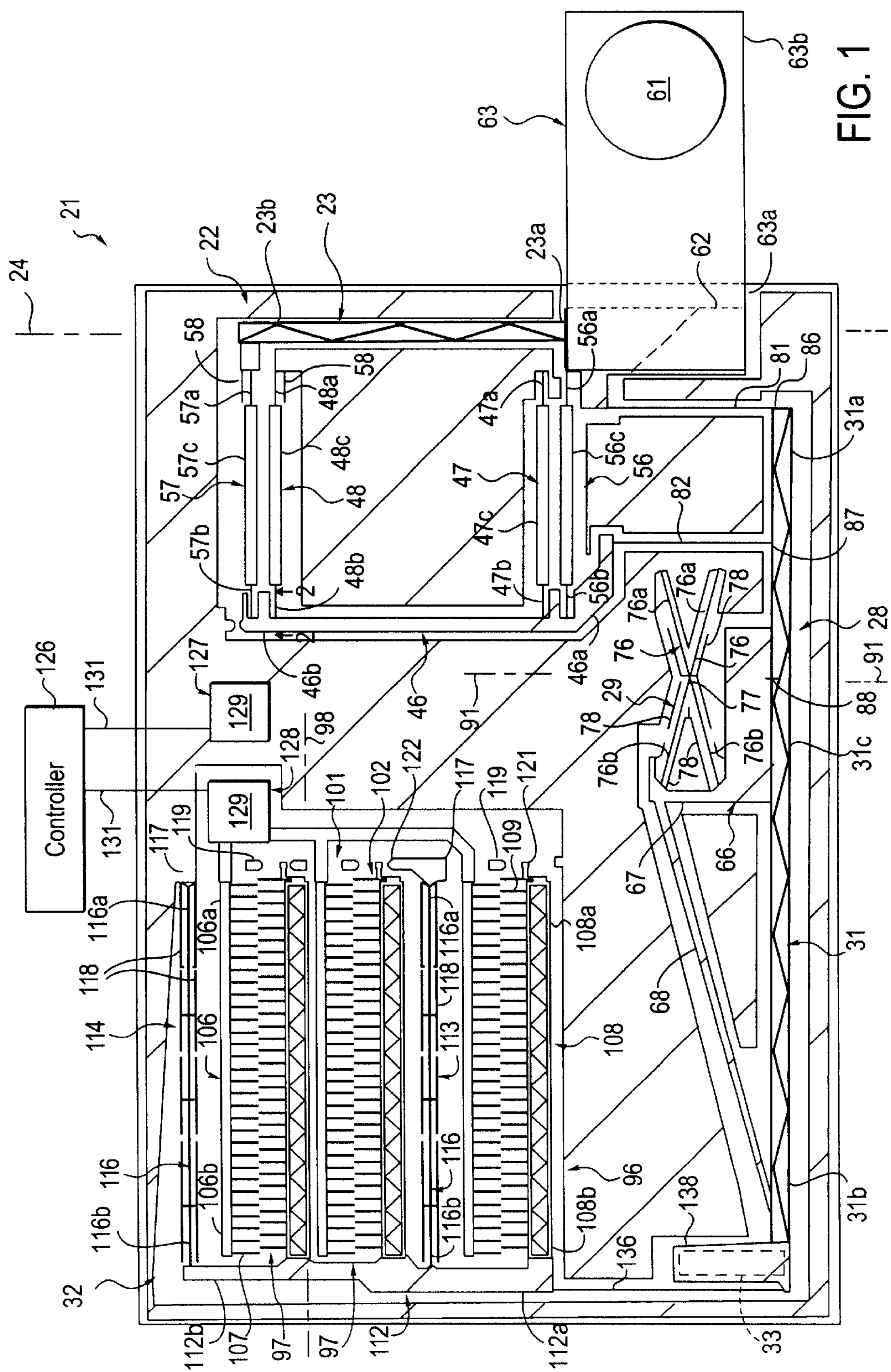
FIG. 1 is a plan view of an miniature device with translatable member of the present invention in a first position.

The miniature device of the present invention can be in the form of a lens adjuster 21 suitable for use in a telecommunications system of the type disclosed in copending U.S. patent application Ser. No. 09/728,212 filed Nov. 29, 2000, the entire content of which is incorporated herein by this reference. In general, lens adjuster 21 includes a translation assembly 22 having a translatable element or primary movable member 23 translatable along a line 24 (see FIG. 1). A lever assembly 28 is coupled to translation assembly 22 and includes a pivot assembly or pivot 29 and a lever arm or lever 31. A motor 32 is further coupled to lever assembly 28 for driving the primary movable member 23 along translation line 24. A counterbalance 33 is optionally provided for inhibiting undesirable movements of primary movable member 23 along line 24. Translation assembly 22, lever assembly 28 and motor 32 are formed on a planar substrate 36, preferably the same substrate, made from any suitable material such as silicon. Substrate 36 is formed from a silicon wafer and has a thickness ranging from 200 to 600 microns and preferably approximately 400 microns. The translation assembly, pivot assembly and motor are formed atop the substrate 36 by a second or top layer 37 made from a wafer of any suitable material such as silicon (see FIG. 2). Top layer or wafer 37 has a thickness ranging from 10 to 200 microns and preferably approximately 85 microns and is secured at certain points to the substrate 36 by any suitable means. In one preferred embodiment, top wafer 37 is fusion bonded to substrate 36 by a silicon dioxide layer 38 having a thickness ranging from 0.1 to two microns and preferably approximately one micron. Translation assembly 22, lever assembly 28 and motor 32 are formed from top wafer 37 by any suitable technique, and are preferably etched from the wafer 37 using deep reactive ion etching (DRIE) techniques or the Lithographie Gavanometrie and Abformung (LIGA) process. Such DRIE techniques or LIGA process permit the etching of features with an aspect ratio of about 20:1, that is, they have a depth that is 20 times greater than the width of a beam feature or an etched groove so as to have a high degree of stiffness out of the plane of substrate 36. Each of the movable components of the translation assembly, lever assembly and motor have a thickness approximating the thickness of top wafer 37. Such components are suspended above the substrate by a gap 39 that ranges from one to 30 microns so as to be electrically isolated from the substrate 36 (see FIG. 2).

Translation assembly 22 includes a primary movable member 23 and an intermediate element or secondary movable member 46 suspended above the substrate 36. Movable members 23 and 46, each of which is substantially rigid, extend substantially parallel to each other. The primary movable member 23 has first and second spaced-apart portions 23*a* and 23*b*, and the secondary movable member 46 has first and second spaced-apart portions 46*a* and 46*b*. First and second spring or suspension members 47 and 48 are provided for suspending secondary movable member 46 over the substrate 36. First suspension member or flexural element 47 has opposite first and second end portions 47*a* and 47*b* and a central portion 47*c*. Second suspension member or flexural element 48 has opposite first and second end portions 48*a* and 48*b* and a central portion 48*c*.

Each of the suspension members 47 and 48 can be of any suitable type such as a suspension member or spring having a constant width along the length thereof as disclosed in U.S. patent application Ser. No. 09/547,698 filed Apr. 20, 2000, the entire content of which is incorporated herein by this reference. In one preferred embodiment of the invention, however, suspension members 47 and 48 are of the type disclosed in U.S. patent application Ser. No. 10/100,545 filed Mar. 14, 2002 (Attorney Docket No. A-70390), the entire content of which is incorporated herein by this reference. In general, the first and second end portions of each of the suspension members 47 and 48 is rectangular in shape and has a width ranging from one to ten microns and preferably approximately four microns and the central portion of each of such suspension members is rectangular in shape and has a greater width ranging from ten to 50 microns and preferably approximately 20 microns. As such, the suspension members are flexible or bendable at the end portions and are relatively rigid or stiff at the central portion.

First end portion 47*a* of the first suspension member 47 is coupled to substrate 36 in the vicinity of first portion 23*a* of primary movable member 23 and second end portion 47*b* of the first suspension member is coupled to first portion 46*a* of secondary movable member 46. More specifically, the first end portion 47*a* is joined to top layer 37 so as to be rigidly coupled to the substrate 36, while second end portion 47*b* is preferably joined directly to secondary movable member 46. In a similar manner, first end portion 48*a* of the second suspension member 48 is coupled to substrate 36 in the vicinity of second portion 23*b* of the primary movable member and second end portion 48*b* of the second suspension member is coupled to second portion 46*b* of the secondary movable member. First and second suspension members 47 and 48 are preferably of equal length and can have a length ranging from 100 to 1000 microns and preferably approximately 500 microns.

Third and fourth suspension members 56 and 57, substantially similar in construction to first and second suspension members 47 and 48, are further provided in translation assembly 22. Third suspension member has opposite first and second end portions 56*a* and 56*b* and a central portion 56*c* having a width greater than the width of end portions 56*a* and 56*b*. Fourth suspension member 57 has opposite first and second end portions 57*a* and 57*b* and a central portion 57*c* having a width greater than the width of end portions 57*a* and 57*b*. First end portion 56*a* of the third suspension member is coupled to first portion 46*a* of the secondary movable member and second end portion 56*b* of such suspension member is coupled to first portion 23*a* of primary movable member 23. Similarly, first end portion 57*a* of the fourth suspension member is coupled to second portion 46*b* of the secondary movable member and second end portion 57*b* of such suspension member is coupled to second portion 23*b* of the primary movable member. The third and forth suspension members are preferably equal in length and are further preferably equal in length to first and second suspension members 47 and 48. Sacrificial bars or beams 58 of the type described in U.S. Pat. No. 5,998,906 can optionally extend along either or both sides of the end portions of suspension members 47, 48, 56 and 57 for ensuring even etching and thus the desired rectangular cross section of such portions of the suspension members.

Figure 2:
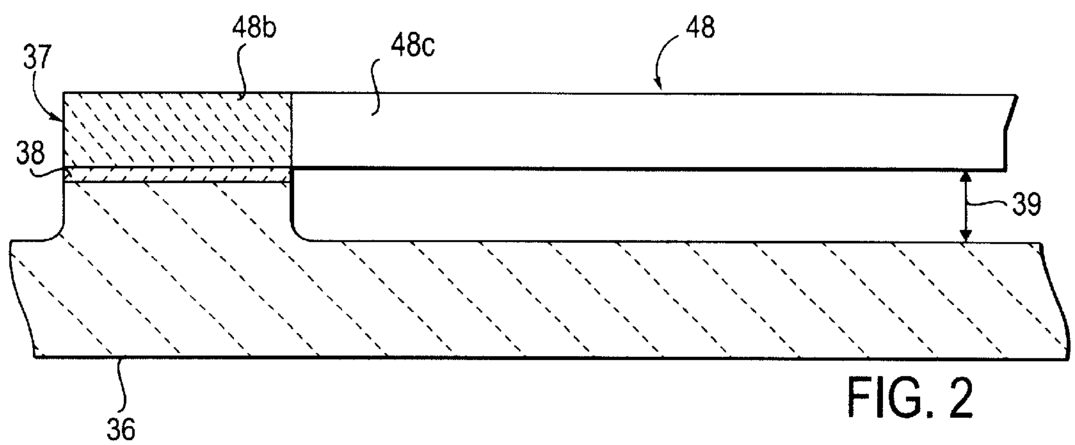
FIG. 2 is a cross-sectional view of the miniature device of FIG. 1 taken along the line 2—2 of FIG. 1.

First and second suspension members 47 and 48 are preferably parallel to each other and perpendicular to primary and secondary movable members 23 and 46 when such movable members are in their rest positions shown in FIG. 1. Third and fourth suspension members 56 and 57 are preferable parallel to each other and to the first and second suspension members and, as such, perpendicular to the at rest movable members 23 and 46 as shown in FIG. 1. First and second suspension members 47 and 48 permit secondary movable member 46 to move in a substantially linear direction of travel parallel along line 24 between a first or rest position, shown in FIG. 1, and a second or actuated position, shown in FIG. 3. During movement of the secondary movable member from its first position to its second position, third and fourth suspension members 56 and 57 permit primary movable member 23 to move in a substantially linear direction of travel along line 24 between a first or rest position, shown in FIG. 1, and a second or actuated position, shown in FIG. 3. Movement of the member 23 is thus centered on line 24.

Although miniature device 21 can be used for translating any element along or parallel to line 24, in the preferred embodiment disclosed herein the device 21 translates an optical element, and preferably lens 61, in a direction of travel parallel to translation line 24. In this regard, first portion 23*a* of primary movable member 23 includes a platform or pad 62 for carrying lens 61. In one preferred embodiment, lens 61 is formed from the material of a lens block 63 having first and second portions 63*a* and 63*b*. First portion 63*a* of the elongate lens block is secured to mounting pad 62 by any suitable means such as an adhesive. Lens 61 is formed in second portion 63*b* and, when block 63 is mounted to pad 62, preferably extends from one side of substrate 36.

A more detailed description of lever assembly 28 will now be provided. The elongate and substantially rigid lever 31 has a first extremity 31*a* coupled to primary movable member 23, an opposite second extremity 31*b* and a central portion 31*c*. A bracket 66 is joined to central portion 31*c* and includes an arm 37 extending substantially perpendicular to the linear lever 31. A brace 68 extends from second end portion 31*b* of the lever to the end of arm 67 for inhibiting bending at such second end portion.

Pivot or pivot assembly 29 of lever assembly 28 serves to couple bracket 66 to substrate 36. Pivot assembly 29 is X-shaped in conformation when viewed in plan and is formed from first and second pivot arms 76 which are joined at their center to form a pivot point 77 of the pivot assembly 29. Each of the pivot arms has a first end portion 76*a* joined to top layer 37 in spaced-apart positions and a second end portion 76*b* joined to arm 67 in spaced-apart positions. Each of the pivot arms 76 is capable of bending or flexing and preferably has a cross-sectional configuration, both in shape and dimensions, similar to the end portions of suspension members 47, 48, 56 and 57. Sacrificial bars 78, similar to sacrificial bars 58 discussed above, optionally extend along the side of pivot arms 76 for ensuring even etching of the desired rectangular cross section of the pivot arms. Pivot assembly 29 permits lever 31 to pivot about pivot point 77 in a clockwise direction from a first or rest position, shown in FIG. 1, to a second or actuated position, shown in FIG. 3. Such movement of lever 31 from its first to second positions causes primary and secondary movable members 23 and 46 to move from their first to second positions.

A flexible or bendable first member or coupler 81 serves to couple first extremity 31*a* of lever 31 to first portion 23*a* of primary movable member 23. Specifically, the elongate and substantially linear first coupler 81 has a first end portion joined to first extremity 31*a* and an opposite second end portion joined to first portion 23*a*. The coupler 81 preferably has a cross sectional configuration, including width and thickness, similar to the configuration of the end portions of suspension members 47, 48, 56 and 57 so as to permit bending thereof during movement of lever 31.

A flexible or bendable second member of coupler 82 serves to couple lever 31 to secondary movable member 46. The elongate and substantially linear second coupler 82 has a first end portion joined to lever 31 between first extremity 31*a* and pivot 29 and an opposite second end portion joined to first portion 46*a* of secondary movable member 46. In one preferred embodiment, first coupler is joined to lever arm 31 at a first location 86 and second coupler 82 is joined to the lever arm at a second location 87. Second location 87 is located midway between first location 86 and a third location 88 on lever 31 where an imaginary line 91 extending through pivot point 77 extends perpendicularly through the lever (see FIG. 1). As such, second location 87 is equal distance between first location 86 and third location 88.

Figure 3:
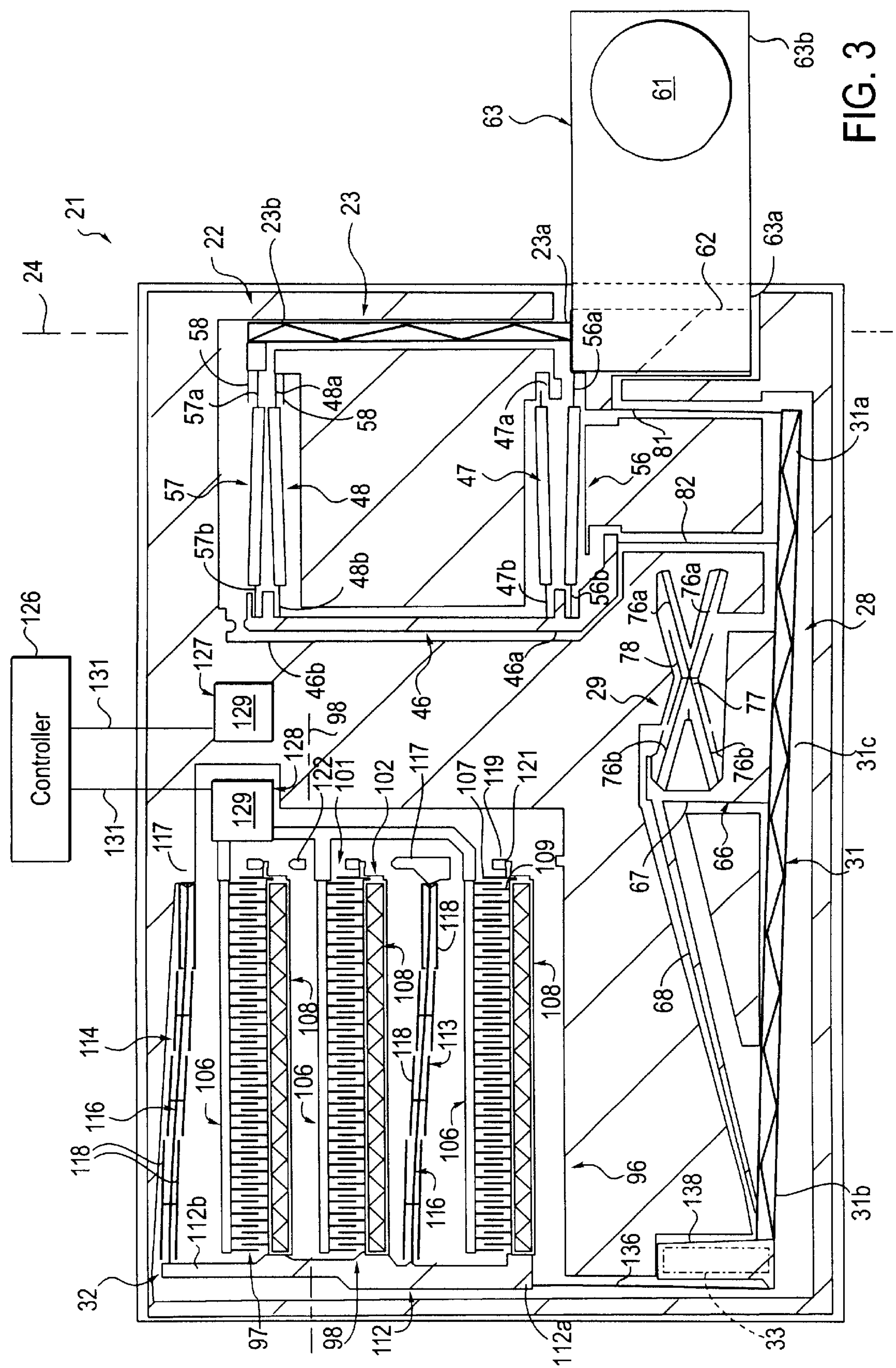
FIG. 3 is a plan view of the miniature device of FIG. 1 in a second position.

A motor 96 can optionally be coupled to lever assembly 28 for driving lever 31 from its rest position of FIG. 1 to its actuated position of FIG. 3. Although any suitable motor can be provided, lens adjuster 21 preferably has a microactuator and more preferably has an electrostatic microactuator coupled to lever assembly 28. More specifically, motor 96 is preferably similar in construction to the microactuator disclosed in U.S. patent application Ser. No. 09/547,698 filed Apr. 20, 2000. Motor 96 is formed from top wafer 37 atop substrate 36. At least one comb drive assembly and preferably a plurality of comb drive assemblies 97 are included in motor 96 for driving lever 31 from its first position to its second position. As shown in FIGS. 1 and 3, three comb drive assemblies 97 extending parallel to a longitudinal axis 98 of motor 96 are provided.

The comb drive assemblies 97 are similar in construction and each has a length ranging from 200 to 2000 microns and preferably approximately 800 microns. A first drive member or comb drive member 101 mounted on substrate 36 and a second drive member of comb drive member 102 overlying the substrate are provided for each of the comb drive assemblies 97. The first or stationary comb drive 101 is immovably secured to substrate 36 and is formed from a longitudinally-extending truss or bar 106 having first and second end portions 106*a* and 106*b*. A plurality of first comb drive fingers or stationary comb fingers 107 extend from one side of bar 106 in longitudinally spaced-apart positions along the length of the bar. The second or movable comb drive 102 of each of the comb drive assemblies 97 is spaced above substrate 36 so as to be movable relative to the substrate and the respective stationary comb drive 101. The movable comb drive 102 has a construction similar to the stationary comb drives 101 and, more specifically, is formed with a longitudinally-extending truss or bar 108 having first and second end portions 108*a* and 108*b*. A plurality of second comb drive fingers or movable comb fingers 109 extend from one side of each bar 107 in longitudinally spaced-apart positions along the length of the bar.

Movable comb fingers 109 of each comb drive assembly 97 face the stationary comb fingers 107 of such comb drive assembly. Stationary and movable comb fingers 107 and 109 can be of any suitable type and are shown as being similar in construction. Each of the comb fingers 107 and 109 has a length ranging from 15 to 150 microns and preferably approximately 60 microns.

The second end portion 108*b* of each movable bar 108 is rigidly attached to an elongate member or shuttle 112 having first and second end portions 112*a* and 112*b*. The substantially rigid shuttle 112 extends at an approximate right angle to the movable bars 108 and such bars 108 are joined to the shuttle at longitudinally spaced-apart positions.

Movable comb drives 102 and shuttle 112 are supported or suspended above substrate 36 by first and second spaced-apart flexural members or springs 113 or 114. Springs 113 and 114 further provide linear stiffness along longitudinal axis 98 to movable comb drives 102. Each of the springs or suspensions 113 and 114 has a length approximating the length of comb drive assemblies 97. Although springs 113 and 114 can be of any suitable construction, each of the springs is preferably formed from an elongate beam-like member or flexural beam 116 having a first end portion 116*a* coupled to substrate 36 at an anchor 117 and a second end portion 116*b* joined to the respective first end portion 112*a* or second end portion 112*b* of the shuttle so as to be coupled to the movable comb drives 102 of motor 96. Each flexural beam 116 has a cross-sectional shape, including width and thickness, similar to the cross-sectional shape of the end portions of suspension members 47, 48, 56 and 57. First and second elongate sacrificial beams or bars 118, each of a type described in U.S. Pat. No. 5,998,906, optionally extend along each side of each flexural beam 116 to enhance even etching of the flexural beam and thus formation of the desired rectangular cross section of the flexural beam. Two of comb drive assemblies 87 are disposed between first and second springs 113 and 114 and one of the comb drive assemblies 97 is not between springs 113 and 114. It should be appreciated that all of the comb drive assemblies 97 can be disposed between springs 113 and 114 or all of the assemblies 97 can be outside of, that is not between, the springs 113 and 114 and be within the scope of the invention.

First and second flexible springs 113 and 114 permit each of the movable comb drives 102 to move from a first or rest position shown in FIG. 1, in which comb fingers 107 and 109 are not substantially fully interdigitated, to a second or actuated position shown in FIG. 3, in which comb fingers 107 and 109 are substantially filly interdigitated. As used herein, the term "not substantially filly interdigitated" is broad enough to cover comb fingers which are fully disengaged, for example as shown in FIG. 1 with respect to comb fingers 107 and 109, as well as comb fingers which are partially interdigitated (not shown). Movement of second comb drives 102 to their respective second positions causes shuttle 112 to move substantially in a linear in a direction of travel relative to substrate 36. At least one and as shown a plurality of stops 119 are mounted on substrate 36 for engagement with respective bumpers 121 provided on one or more of the first end portions 108*a* of the movable comb drives to limit the travel of such movable bars 108 during interdigitation of comb fingers 107 and 109. As shown in FIG. 3, the engagement of bumpers 121 with stops 119 defines the second position of the movable comb drives 102. At least one and as shown a plurality of additional stops 122 are provided for engagement by bumpers 121 to limit the return travel of movable comb drives 102.

Stationary and movable comb fingers 107 and 109 are preferably of the type disclosed in U.S. patent application Ser. No. 09/547,698 filed Apr. 12, 2000 and, as such, are inclined and offset. In general, each of the comb fingers 107 and 109 is slightly inclined from a line extending normal to the respective bar 106 or 108. In addition, when movable comb drives 102 are in their first or rest position shown in FIG. 1, each of movable comb fingers 109 is offset relative to a midpoint line extending between the adjacent pair of stationary comb fingers 107 into which such movable comb fingers 109 interdigitate. When the movable comb drives 102 move to their second positions, each movable comb finger 109 becomes centered on such midpoint line. The inclination and offset of stationary and movable comb fingers 107 and 109 accommodate the foreshortening and deflection of first and second springs 113 and 114 and the resulting movement of movable comb drives 102 along longitudinal axis 98 as the movable comb drives 102 move from their first positions, in which springs 113 and 114 are straight as shown in FIG. 1, to their second positions, in which springs 113 and 114 are bent or deflected as shown in FIG. 3.

Electrical means is included for driving movable comb drives 102 between their first and second positions. Such electrical means can include a controller and voltage generator 126 connected to a plurality of electrodes provided on substrate 36. Such electrodes include a ground or common electrode 127 coupled to at least one of anchors 117 and thus movable comb drives 102 and at least one drive electrode 128 coupled to stationary comb drives 101. A metal layer or pad 129 made from aluminum or any other suitable material is provided on the top surface of upper layer 37 for creating the electrodes. Controller and voltage generator 126, typically not an integral part of lens adjustor 21, is electrically coupled by leads or other means 131 to electrodes 127 and 128 and is shown schematically in FIGS. 1 and 3. Means in the form of a closed loop servo control, such as of the type disclosed in U.S. patent application Ser. No. 09/728,212 filed Nov. 29, 2000, can be included for monitoring the position of movable comb drives 102 and thus lens 61.

Although motor 96 is shown as having comb fingers which substantially interdigitate in only a single direction, it should be appreciated that a motor having one or more first comb drive assemblies with comb fingers which substantially interdigitate when the motor is moving in a first direction and one or more second comb drive assemblies with comb fingers which substantially interdigitate when the motor is moving in an opposite second direction can be provided and be within the scope of the present invention.

A flexible or bendable third member or coupler 136, substantially similar to first coupler 81 described above, serves to couple shuttle 112 to lever 31. More specifically, a first end portion of third coupler 136 is joined to second extremity 31*b* of lever arm 31 and a second end portion of the coupler 136 is joined to first end portion 112*a* of shuttle 112.

Means is optionally included within lens adjuster 21 for mechanically balancing the movable components thereof in their direction of travel. More specifically, the mass of the movable components of lens adjustor 21 is adjusted so that the torque in the clockwise direction about pivot point 77 of pivot assembly 29 is substantially equal to the torque in the counterclockwise direction about such pivot point. Although any number of means can be utilized for adjusting the dimensions and mass of the movable components of lens adjustor 21 to achieve such mechanical balancing, in one preferred embodiment a counterbalance 33 is attached to such movable components and preferably carried by lever arm 31. In a particularly preferred embodiment, an additional platform 138 is included on lever arm 31 and counterbalance 33 is mounted to such platform by any suitable means such as an adhesive. Platform 138 is shown in FIGS. 1 and 3 as being at second extremity 31*b* of the lever arm 31.

Device 21 can be scaled larger or smaller to any suitable size. Lens adjuster 21 is relatively small and has a length, parallel to motor axis 98, of approximately 2.7 millimeters and a width, parallel to line 24, of approximately 1.8 millimeters. The distance between first and third locations 86 and 88, that is 2L, is approximately 0.7 millimeters and the distance between third location 88 and the point where third coupler 136 joins lever arm 31 is approximately 1.6 millimeters. Such dimensions provide a lever ratio of 44%, that is lens 61 will translate 44% of the travel distance of shuttle 112. Motor stops 119 permit shuttle 112 to travel a maximum distance of approximately 50 microns from its first position to its second position, thus translating lens 61 a maximum distance of approximately 22 microns from its first position of FIG. 1 to its second position of FIG. 3. Lens adjuster 21 is particularly suited for actively controlling lens 61 to collimate a beam of light emitted from the cleaved facet of a waveguide.

In operation and use, motor 96 is electrically controlled by controller 126 to drive shuttle 112 in a rearward direction (an upward direction in FIG. 1) from its rest position shown in FIG. 1 to its actuated position shown in FIG. 3. Such retraction of shuttle of 112 pulls lever 31 in a clockwise direction about pivot point 77 so as to pull primary movable member 23 and secondary movable member 46 in forward directions (downward directions in FIG. 1) to their respective actuated positions shown in FIG. 3. The bendable third coupler 136 accommodates the pivoting of lever 31 relative to shuttle 112 while flexible first and second couplers 81 and 82 accommodate the pivoting of the lever 31 relative to respective primary and secondary movable members 23 and 46. Third coupler 136 also accommodates the parasitic motion of shuttle 112, that is motion perpendicular to the direction of travel of the shuttle, during travel of the shuttle.

The combination of first and third suspension members 47 and 56 serve as one folded suspension and the combination of the second and forth suspension members 58 and 57 serve as another folded suspension for causing primary movable member 23 to translate along line 24 as it is pulled by lever 31. Half of the movement of the primary movable member 23 is contributed by first and second suspension members 47 and 48 and the other half of the movement of the primary movable member is contributed by third and fourth suspension members 56 and 57. The slight foreshortening of first suspension member 47 from its rest position of FIG. 1 following movement of primary movable member 23 is offset by a similar foreshortening of third suspension member 56 so that first portion 23*a* of the primary movable member 23 is not moved in a direction perpendicular to translation line 24 as it travels along the line 24. In a similar manner, the foreshortening of fourth suspension member 57 offsets the foreshortening of second suspension member 48. In combination, the first folded suspension formed by first and third suspension members 47 and 56 and the second folded suspension formed by second and fourth suspension members 48 and 57 serves to inhibit if not eliminate any parasitic motion of primary movable member 23 perpendicular to line 24 during movement of the primary movable member 23 between its first and second positions. The foregoing balancing of the parasitic motion of primary movable member 23 results, in the preferred embodiment described herein from the equal sizing of suspension members 47, 48, 56 and 57.

Second coupler 82 advantageously serves to constrain the travel of secondary movable member 46 as the member 46 moves from its first position of FIG. 1 to its second position of FIG. 3. A schematic view of lens adjustor 21 in such first and second positions is shown respectively in FIGS. 4 and 5, where certain components of translation assembly 22, lever assembly 28 and motor 32 are shown. As can be seen therein, the retraction of shuttle 112 causes lever arm 31 to pull and thus translate primary movable member 23 in a linear first direction of travel as the movable member 23 moves from its first position in FIG. 4 to its second position in FIG. 5. Secondary movable member 46 is simultaneously pulled by the lever arm in a substantially linear second direction of travel that is substantially parallel to the first direction of travel of primary movable member 23. Second coupler 82 joins lever arm 31 a distance L from the third location 88 where imaginary line 91 intersects the lever arm 31 and a distance L from the first location 86 where first coupler 81 joins the lever arm. Since second location 87 is thus equidistance between the first and third locations 86 and 88, the second distance D/2 traveled by secondary movable member 46 from its first position to its second position is constrained by the second coupler to be half as long as the first distance D traveled by primary movable member 23 from its first position to its second position.

Figure 4:
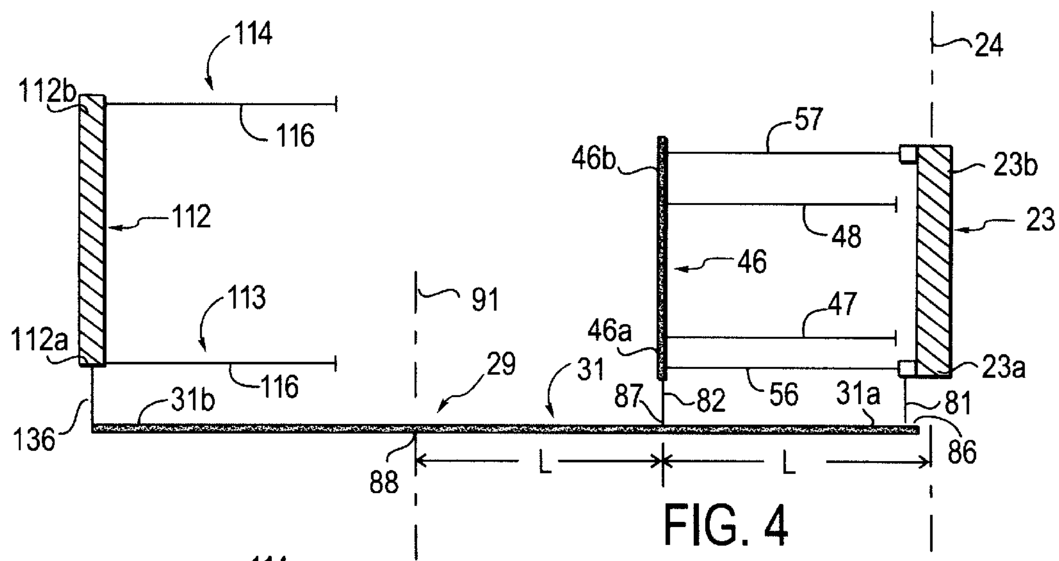
FIG. 4 is a plan view of a simplified model of the miniature device of FIG. 1 in the first position of FIG. 1.
Figure 5:
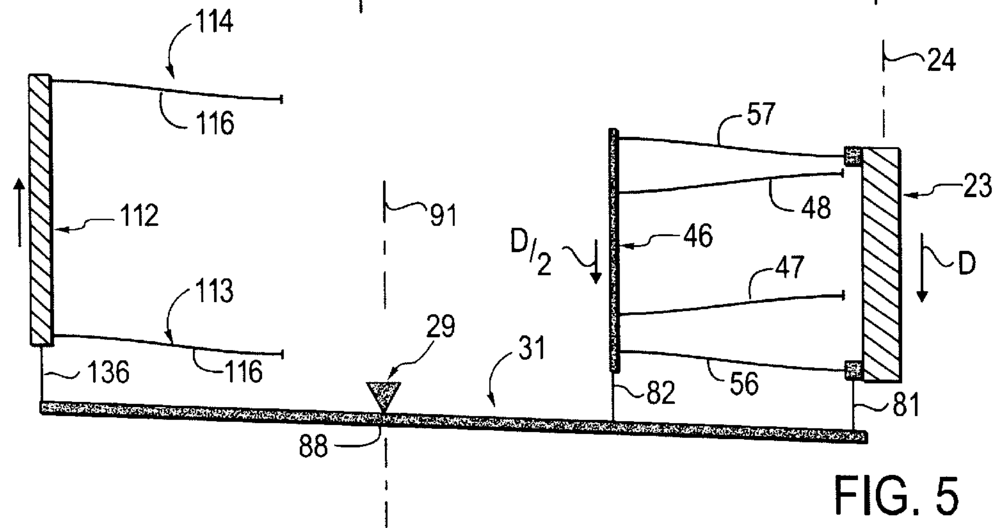
FIG. 5 is a plan view of simplified model of the miniature device of FIG. 1 in the second position of FIG. 3.

As so constrained by second coupler 82, secondary movable member 46 is precluded from uncontrolled travel, whether upward or downward in FIGS. 4 and 5 or not at all, while primary movable member 23 moves between its first and second positions. Such uncontrolled travel can significantly reduce the side stiffness of suspension members 47, 48, 56 and 57, that is the stiffness in the direction perpendicular to line 24, and thus contribute to movement of primary and secondary movable members 23 and 46 in such direction due to bending of the suspension members. Such uncontrolled travel can also undesirably impose parasitic motion on the primary movable member 23 in a direction perpendicular to translation line 24. Accordingly, second coupler 82 insures that the movement of primary movable member 23 is purely translational along line 24 and free of parasitic movement perpendicular to such line. This purely translational movement of primary movable member 23 permits lens 61 to be translated and held in a variety of positions without undesirable parasitic motion, which can be advantageous in a telecommunications system.

The controlled movement of secondary movable member 46 described above further inhibits compromise of the stiffness of suspension members 47, 48, 56 and 57.

Counterbalance 33 serves to inhibit undesirable movements of lens 61 in its direction of travel as a result of vibrations or other external forces that may be experienced by lens adjuster 21. Without such counterbalancing, such external forces cause inertial forces on the movable masses of the device that are likely to overcome the electrostatic hold forces of motor 96 and thus cause the lens to undesirably move during operation of lens adjustor 21. Lever assembly 28 of lens adjuster 21 advantageously serves both to constrain the motion of secondary movable member 46 and to carry the counterbalance 33 for balancing the torques about pivot point 77.

The placement of pivot point 77 along the length of lever arm 31 can be chosen so that the movement of lever first extremity 31*a* is less than, equal to or greater than the movement of lever second extremity 31*b* during pivoting of the lever arm 31 about pivot point 77. The lever assembly 28 thus permits a motion reducing or motion multiplying effect between shuttle 112 and primary movable member 23. As shown in FIGS. 1 and 3, pivot point 77 has been placed close to first extremity 31*a* of the lever arm so that the movement of lever first extremity 31*a*, and thus primary movable member 23, is less than the movement of lever second extremity caused by shuttle 112. Such reduction in movement between shuttle 112 and primary movable member 23 facilities fine positioning of lens 61. The motion reduction of lever assembly 28 also increases the effect of counterbalance or balancing mass 33, that is permits a smaller counterbalance 33 to be used for offsetting the relatively large mass of lens block 63.

Miniature device 21 can be used for translating any optical or other miniature element. Other optical elements suitable for translating with device 21 include prisms and shutters. In addition, the miniature device of the present invention can be other than an actuator. For example, the invention is applicable to sensors, accelerometers and numerous other devices having translatable or other movable members.

As can be seen from the foregoing, a miniature device having a translatable member with a relatively large adjustment range has been provided. The translatable member is capable of place and hold positioning along a line and can have a relatively high immunity along such line to external forces such as vibration. The miniature device is capable of translating an optical element such as a lens.

What is claimed is:

1. A miniature device comprising a substrate, primary and secondary movable members overlying the substrate, first and second suspension members for coupling the secondary movable member to the substrate, third and fourth suspension members for coupling the primary movable member to the secondary movable member, a lever assembly having a pivot and a lever coupled to and pivotable about the pivot, the lever having a first extremity coupled to the primary movable member and an opposite second extremity, and a coupler for coupling the secondary movable member to the lever between the first extremity and the pivot.

2. A miniature device as in claim 1 further comprising an optical element carried by the primary movable member.

3. A miniature device as in claim 1 wherein the primary movable member extends substantially parallel to the secondary movable member.

4. A miniature device as in claim 3 wherein the first and second suspension members and the third and fourth suspension members are substantially parallel to each other when the primary movable member is in one position.

5. A miniature device as in claim 1 wherein the pivot has as pivot point and the first extremity of the lever is coupled to the primary movable member at a first location, the coupler being coupled to the lever at a second location approximately midway between the first location and a third location where an imaginary line extending through the pivot point extends perpendicularly through the lever.

6. A miniature device as in claim 1 wherein each of the first and second suspension members has a length and each of the third and fourth suspension members has a length equal to the length of the first and second suspension members.

7. A miniature device as in claim 6 wherein the primary movable member moves a first distance from a first position to a second position and wherein the secondary movable member moves a second distance that is half as long as the first distance from a first position to a second position.

8. A miniature device as in claim 1 further comprising a motor coupled to the second extremity of the lever for driving the primary movable member from a first position to a second position.

9. A miniature device as in claim 8 wherein the motor is a microactuator.

10. A miniature device as in claim 9 wherein the microactuator is an electrostatic microactuator.

11. A miniature device as in claim 8 subject to external forces further comprising a counterbalance carried by the lever for inhibiting movement of the primary movable member from the external forces.

12. A miniature device comprising a substrate, a translatable element and an intermediate element overlying the substrate, at least one folded flexural suspension having a first flexural element for coupling the intermediate element to the substrate and a second flexural element for coupling the translatable element to the intermediate element, a pivoting lever having an extremity, a first coupler for connecting the translatable element to the extremity and a second coupler for connecting the intermediate element to the lever so as to constrain the intermediate element to translate substantially half the translation of the translatable element.

13. A miniature device as in claim 12 wherein the pivoting lever has an additional extremity opposite the first-named extremity, a motor coupled to the additional extremity for moving the translatable element between first and second positions.

14. A miniature device as in claim 13 further comprising an optical element carried by the translatable element.

15. A miniature device as in claim 12 wherein the pivoting lever has an additional extremity opposite the first-named extremity, a mass carried by the additional extremity and sized to reduce the response of the translatable element to accelerations imposed on the device.

16. A miniature device comprising a substrate, a primary movable member overlying the substrate and having first and second spaced-apart portions, a secondary movable member overlying the substrate and having first and second spaced-apart portions, first and second suspension members, the first suspension member having a first end portion coupled to the substrate in the vicinity of the first portion of the primary movable member and a second end portion coupled to the first portion of the secondary movable member and the second suspension members having a first end portion coupled to the substrate in the vicinity of the second portion of the primary movable member and a second end portion coupled to the second portion of the secondary movable member, third and fourth suspension members, the third suspension member having a first end portion coupled to the first portion of the secondary movable member and a second end portion coupled to the first portion of the primary movable member and the fourth suspension members having a first end portion coupled to the second portion of the secondary movable member and a second end portion coupled to the second portion of the primary movable member, a lever assembly having a pivot and a lever coupled to and pivotable about the pivot between first and second positions, the lever having a first extremity coupled to the first portion of the primary movable member and an opposite second extremity, and a coupler for coupling the secondary movable member to the lever between the first extremity and the pivot, the movement of the lever from the first position to the second position causing the first extremity of the lever to move the primary movable member in a substantially linear first direction of travel a first distance and causing the coupler to move the secondary movable member in a substantially linear second direction of travel a second distance that is half as long as the first distance.

17. A miniature device as in claim 16 further comprising a motor coupled to the second extremity of the lever for driving the primary movable member over the first distance from a first position to the second position.

18. A miniature device as in claim 17 wherein the motor is an electrostatic microactuator.

19. A miniature device as in claim 18 subject to external forces further comprising a counterbalance carried by the lever for inhibiting movement of the primary movable member from the external forces.

20. A miniature device as in claim 19 further comprising an optical element carried by the primary movable member.

* * * * *